(12) United States Patent
Wang et al.

(10) Patent No.: US 7,864,294 B2
(45) Date of Patent: Jan. 4, 2011

(54) FOCUS SENSITIVE LITHOGRAPHIC APPARATUS, SYSTEMS, AND METHODS

(75) Inventors: Fei Wang, Boise, ID (US); Xinya Lei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 591 days.

(21) Appl. No.: 11/754,578

(22) Filed: May 29, 2007

(65) Prior Publication Data

US 2008/0297752 A1 Dec. 4, 2008

(51) Int. Cl.
G03B 27/42 (2006.01)
G03C 5/00 (2006.01)
G03F 1/00 (2006.01)

(52) U.S. Cl. .............................. 355/55; 355/53; 355/59; 430/5; 430/322

(58) Field of Classification Search .................... 355/53, 355/55, 59, 67, 71; 430/5, 322–324, 394; 250/492.2, 492.22
See application file for complete search history.

(56) References Cited

U.S. PATENT DOCUMENTS 5,300,786 A * 4/1994 Brunner et al. ................. 430/5
6,479,194 B1 * 11/2002 Talor, Jr. ......................... 430/5
2003/0219655 A1 * 11/2003 Sutani et al. .................... 430/5
2005/0208391 A1 * 9/2005 Mieher et al. ................... 430/5
2005/0247669 A1 * 11/2005 Wang et al. .................... 216/59

* cited by examiner

Primary Examiner—Hung Henry Nguyen
Assistant Examiner—Colin Kreutzer
(74) Attorney, Agent, or Firm—Schwegman, Lundberg & Woessner, P.A.

(57) ABSTRACT

A system includes an illuminator, a mask, and a measurement device. The illuminator includes a light source. The mask includes at least one focus determination pattern having a first pattern portion and an adjacent second pattern portion. The first pattern portion and the second pattern portion have substantially the same width but produce a phase difference in light transmitted through the pattern portions. The measurement device measures a first critical dimension and a second critical dimension of a feature produced on a target by the at least one focus determination pattern. The difference between the first critical dimension and the second critical dimension relates to an amount of defocus and is sensitive to the focus change. The system may also include a feedback control loop where a determination regarding an amount of defocus is used to focus the position of a wafer or a mask or both of them onto the target. Additional apparatus, systems, and methods are disclosed.

11 Claims, 10 Drawing Sheets

FOCUS SENSITIVE LITHOGRAPHIC APPARATUS, SYSTEMS, AND METHODS

TECHNICAL FIELD

Various embodiments described herein relate to photolithography, including methods, apparatus, and systems for focusing an optical system with respect to a target during photolithographic patterning.

BACKGROUND INFORMATION

Step and repeat lithography devices, called scanners or wafer steppers, are commonly used to mass produce semiconductor devices such as integrated circuits (ICs). Typically, a light source and various lenses are used to project an image of a mask onto a photosensitive coating of a semiconductor wafer. The projected image of the mask imparts a corresponding pattern on the photosensitive coating. This pattern may be used to selectively etch or deposit material to form desired semiconductor devices.

A photolithographic exposure system includes a light source, a patterned mask, and an optic system that is used to focus and project an image of the mask onto a target, such as a wafer. Several mechanical parts are used to move the wafer to various positions as a new portion of the wafer is exposed to the pattern of the mask with the optic system and the light source. During the manufacturing process, in some instances, the distance between the target and the exposure system may change. In other instances, the focal length of the optical source may change. In either instance, the previously in-focus image at the target may become out of focus. When out of focus, or defocussed, the photolithographic process may produce semiconductor devices that fail or are substandard. For example, critical dimensions may vary outside a selected variance. Accordingly, it is desirable to determine when the photolithographic exposure system is defocussed so that the source of the problem can be both detected and corrected.

Furthermore, continuously reducing the feature size of semiconductor devices seems to be a constant industry goal. For example, reducing the feature size in solid-state memory architecture can be an effective way to increase the capacity of such memories for a given amount of circuit area However, as the feature size continues to become smaller, the problem associated with defocussing of the photolithographic equipment increases, since the critical dimension of certain features has a smaller tolerance range.

DETAILED DESCRIPTION

Figure 1:
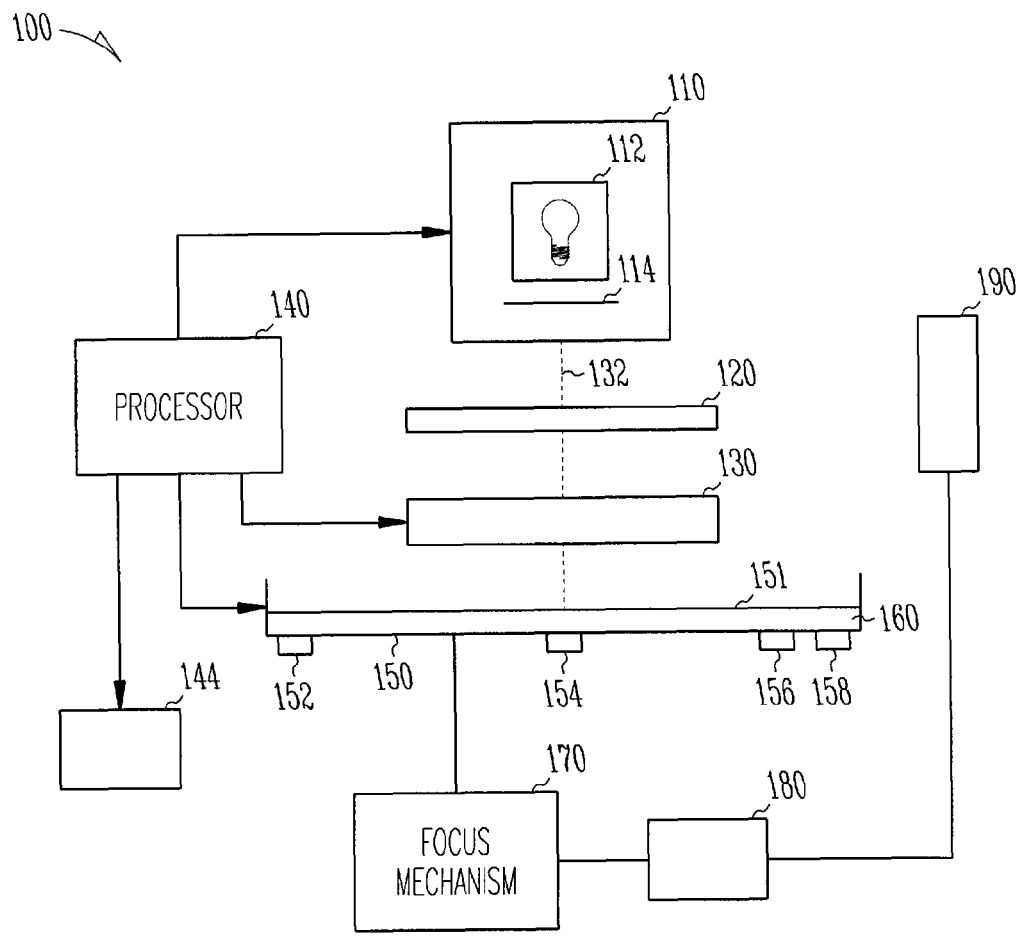
FIG. 1 is a schematic diagram of a projection system, according to an example embodiment of the invention.

FIG. 1 is a schematic diagram of a projection system 100, according to an example embodiment of the invention. The projection system 100 is used in the manufacture of electronic devices and other devices (e.g., mechanical devices) using photolithography. The projection system 100 includes an illuminator 110. The illuminator 110 includes an illumination or light source 112, an object pupil 114, a mask or reticle 120, and a projection lens or pupil 130. The projection system 100 is typically under the control of a microprocessor or processor 140 that is operatively coupled to an input device 144. The input device 144 is a keyboard, control panel, or any other apparatus that permits an operator to input data or commands, or to alter a computer program having an instruction set for controlling the projection system 100. In some embodiments of a projection system 100, the illuminator 110 or the target 148 (e.g., a wafer) is moved and another image is exposed on the target 148. The microprocessor or processor 140 is used to automatically control the movement of the target 148 or the illuminator 110 so that multiple exposures can be made on the target 148. In some embodiments, the target 148 comprises a wafer having a layer of photoresist or photoresistive material applied thereon.

The illumination source 112 provides electromagnetic radiation of a predetermined variety in response to control signals from processor 140 coupled thereto. Typically, the radiation from illumination source 112 is in the visible light or ultraviolet wavelength range. The projection system 100 also includes a mask holder for holding the mask 120 in alignment with illumination source 112. The mask 120 includes a pattern of opaque and transparent regions in the path of radiation from illumination source 112 to cast a desired image into an optical subsystem. The optical subsystem includes the projection lens or pupil 130 and is configured to project an image along optical axis 132. The optical subsystem generally includes a series of lenses (not shown) to properly focus a received image and includes a controlled shutter coupled to processor 140 to selectively emit the image. Typically, an optical subsystem reduces the image size by a known factor relative to the size of the mask and, more specifically, to the size of the pattern on the mask 120. Of course, many projection systems, such as the projection system 100, include additional components than the ones discussed here.

The projection system 100 also includes multistage positioning device 150. Multistage positioning device 150 is operatively coupled to processor 140 to be controlled thereby. Multistage positioning device 150 includes a base 151 and a wafer chuck 160 configured to securely hold the target 148 (e.g., a semiconductor wafer) for lithographic processing by the projection system 100. Positioning apparatus 20 also has a number of independently controlled positioning stages to selectively position wafer chuck 160 relative to optical axis 132 of image projection system 100.

The multistage positioning device 150 includes a stage 152, a stage 154 and a Z stage. The stage 152 positions wafer chuck 160 along a first axis (e.g., "X-axis") perpendicular to the view plane of FIG. 1. Stage 152 responds to a first axis control signal from processor 140 to provide a corresponding X-axis position of wafer chuck 160. The stage 154 positions wafer chuck 160 along a second axis (e.g., "Y-axis") generally perpendicular to the first axis. The stage 154 responds to a second axis control signal from processor 140 to provide a corresponding Y-axis position of wafer chuck 160. The second axis is generally parallel to the view plane of FIG. 1. The Z stage 156 is configured to move the wafer chuck 160 along the Z-axis. In some embodiments, the multistage positioning device includes a tilt stage to controllably pivot wafer chuck 160 about both the X-axis and Y-axis in response to an appropriate tilt control signal from processor 140. Typically, the various stages are moved by stepper motors under control of the processor 140. As a result, such a projection system 100 is called a stepper projection system or a scanner. A stepper or scanner is configured to mass produce integrated circuits by defining a matrix of spaced-apart exposure fields.

The projection system 100 also includes a focus mechanism 170 under control of a feedback control apparatus 180. The projection system includes a measurement device 190 that measures critical dimensions of features formed on the target to determine an amount of defocus. The amount of defocus is entered into the feedback control apparatus 180, which then changes the focus via the focus mechanism 170. The feedback control apparatus 180 and the measurement device 190 may be under the control of the processor 140, in some embodiments. The measurement device 190 can include a scanning electron microscope, in some embodiments.

Figure 2:
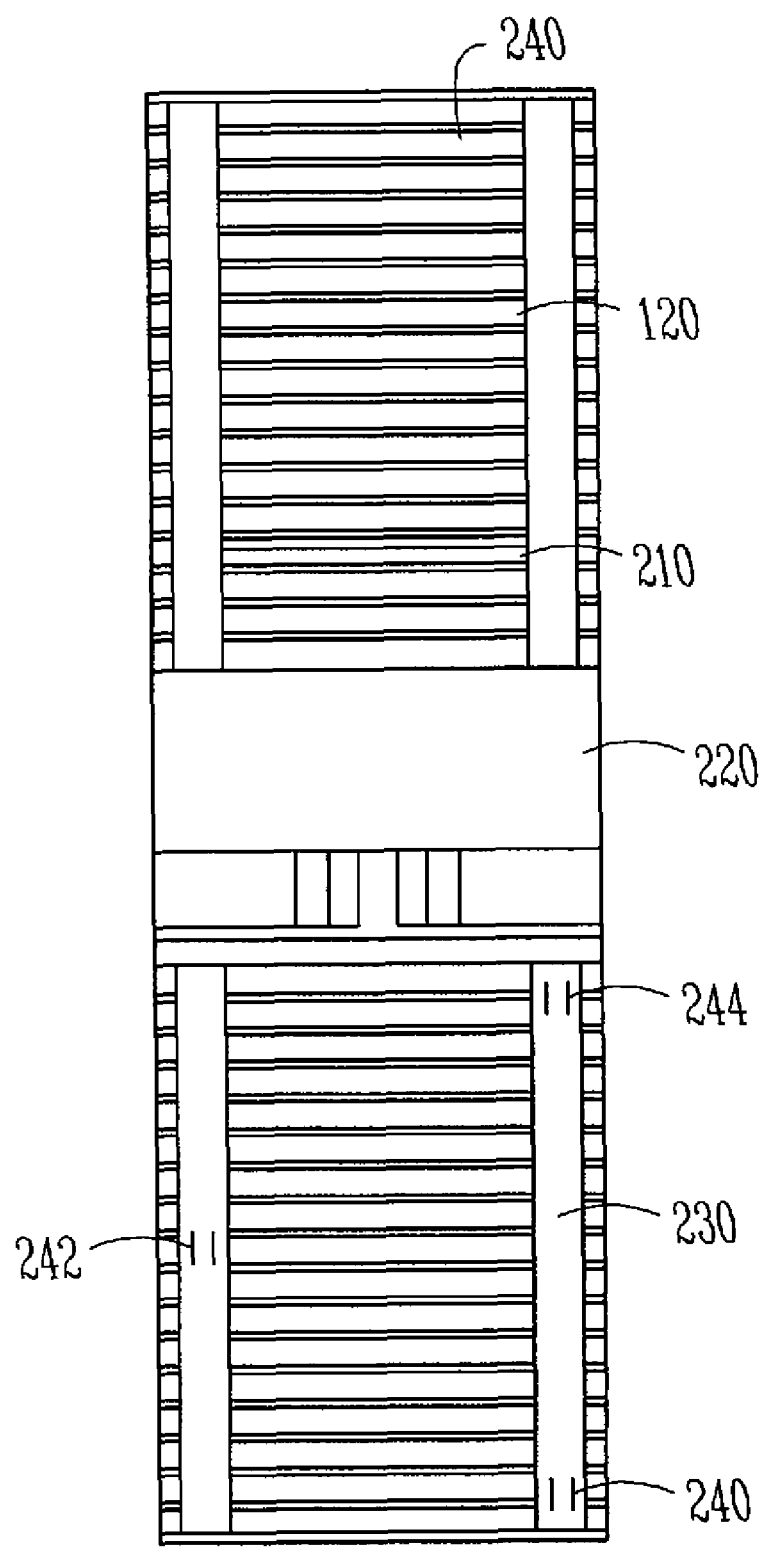
FIG. 2 is a top view of a mask showing a number of open areas in a substantially opaque layer, including at least one focus determination feature, according to an example embodiment of the invention.

FIG. 2 is a top view of a mask 120 showing a number of open areas 210, 220, and 230 in a substantially opaque layer 236, according to an example embodiment of the invention. As shown in FIG. 2, the opaque layer 236 may include many small openings 238 that are used to form features on a target, such as wafer. The mask 120 includes much larger open areas such as a center logic open area 220 or the space between dice that is also referred to as the die-between-die open area 230. The space between the dice may also include streets or saw alleys that are destroyed when the dice are separated from each other. In some instances, a saw is used to singulate the dice into individual dice. In other instances, a laser is used to singulate the dice into individual dice. In some masks 120, there may be certain open areas, such as open area 210, that are formed because of the type of devices formed by the mask 120 in one area. For example, open area 210 is referred to as a sense amp open area. The open areas include at least one focus determination pattern 240. In some embodiments, only a single focus determination pattern 240 is needed. In other embodiments, several focus determination patterns are provided on each mask. As shown in FIG. 2, the mask 120 includes a first focus determination pattern 240, a second focus determination pattern 242, and a third focus determination pattern 244. Three focus determination patterns 240, 242, and 244 can be used to determine the focus of a plane. It should be noted that focus determination features are formed on a target (such as a wafer) by the focus determination patterns 240, 242, and 244 of the mask 120. It should also be noted that all the focus determination features that are formed do not necessarily need to be used as part of a functional die.

Figure 3:
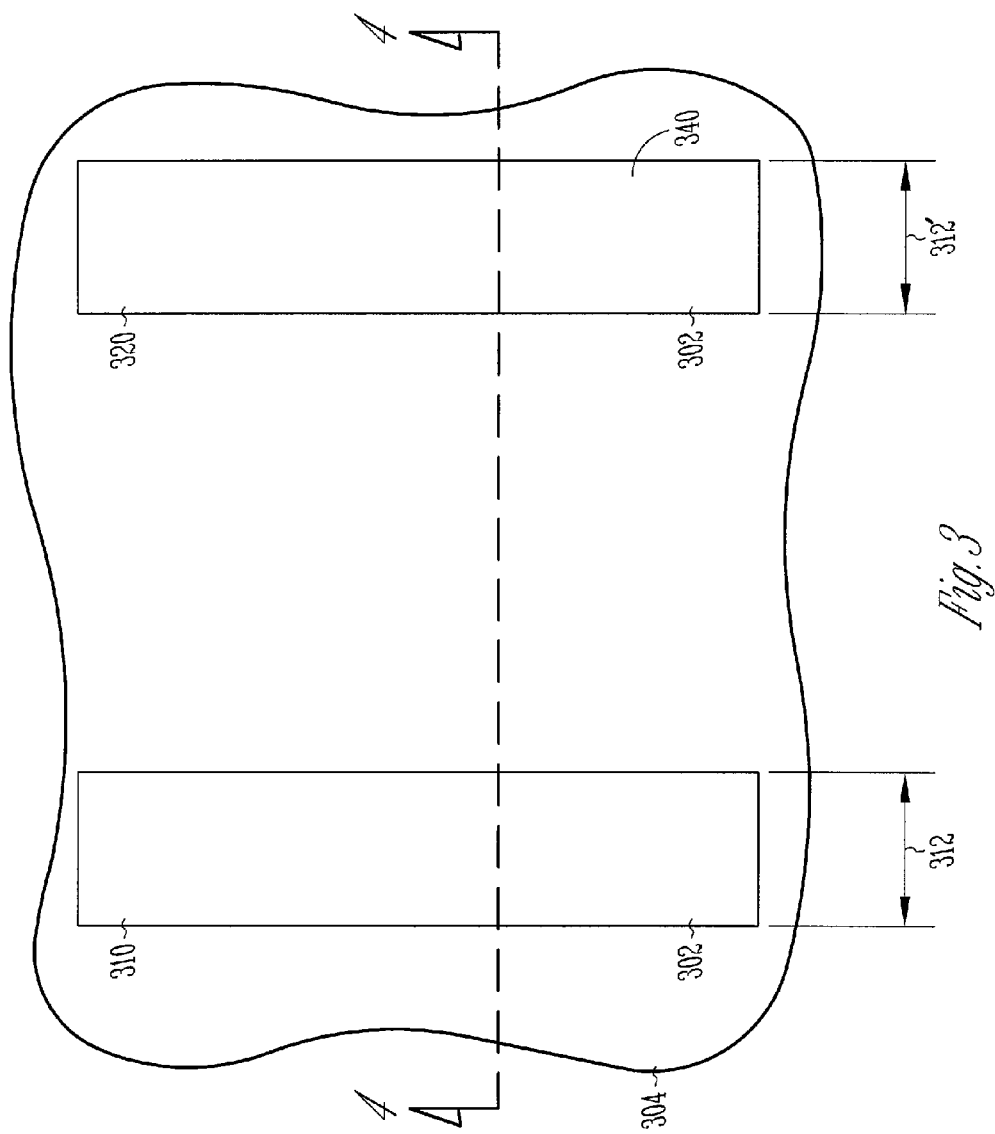
FIG. 3 is a top view of a mask feature showing a number of iso-trenches, according to an example embodiment of the invention.
Figure 4:
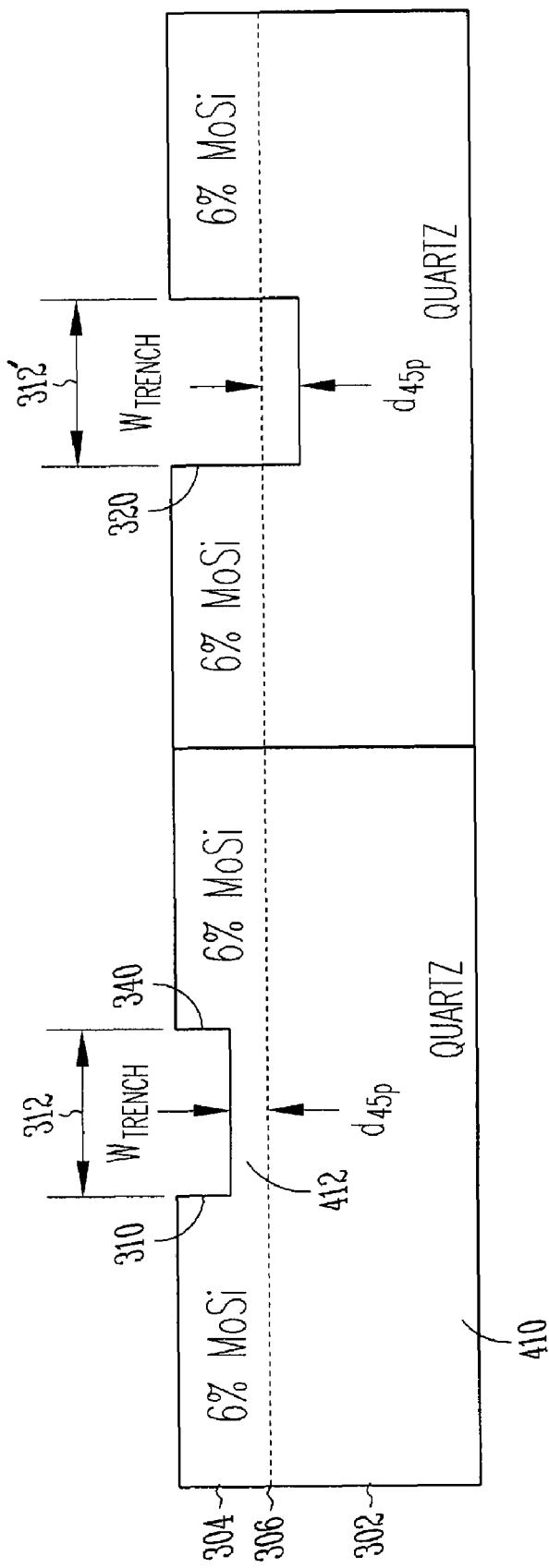
FIG. 4 is a cross-sectional side view of a mask along line 4-4 in FIG. 3, showing a first iso-trench having a first background phase and a second iso-trench having a second background phase.

FIG. 3 is a top view of a focus determination pattern 340 of a mask 300, and FIG. 4 is a cross-sectional side view of a focus determination pattern 340 of the mask 300, according to an example embodiment of the invention. The focus determination pattern 340 produces a focus determination feature on a target, such as a wafer.

Now referring to both FIGS. 3 and 4, the focus determination pattern 340 includes a first iso-trench 310 having selected width and a first feature phase 312 and a second iso-trench 320 having a second feature phase 312'. The mask 300 for producing a semiconductor device includes a glass substrate 302, and a layer of transmissive material 304 positioned on the glass substrate 302. The mask 300 also includes an interface 306 between the glass substrate 302 and the layer of transmissive material 304. In other words, the mask 300 may include an interface 306 at the juncture of the glass substrate 302 and the layer of transmissive material 304. The mask 300, and more specifically the focus determination pattern 340, has a first trench 310 therein and a second trench 320 therein (shown in FIG. 4). The first trench 310 has a selected width $W_{TRENCH}$ and produces a first selected phase delay. The phase delay is a function of the depth $D_1$ of the trench 310. As shown in FIG. 4, the glass substrate has a thickness 410 from the transition 306 to the bottom of the glass substrate 302. The trench 310 includes an extra portion of glass 412 in the bottom of the first trench 310. The thickness of this extra portion of glass is designated as $d_{45p}$. The extra portion of glass is positioned above the transition 306 between the transmissive material 304 and the glass substrate 302. In other words, the first trench 310 has a depth that is above the interface 306 of the transmissive material 304 and the glass substrate 302. The extra thickness, designated $d_{45p}$, produces a phase delay of 45 degrees with respect to the interface 306 between the glass substrate 302 and the transmissive material 304.

The second trench 320 is adjacent the first trench 310, and has the selected width 312' and produces a second selected phase delay different from that of the first phase delay. The width 312' of the second trench 320 may be substantially the same as the width 312 of the first trench 310. The second trench 320 has a depth $D_2$ that terminates below the interface 306 of the transmissive material 304 and the glass substrate 302. The dimension below the interface 306 is also designated as $d_{45p}$. The extra depth of the second trench 320, designated $d_{45p}$, produces another phase delay of 45 degrees with respect to the interface 306 between the glass substrate 302 and the transmissive material 304. Since the first phase delay is caused by an extra portion of glass 412 above the interface 306 and the second phase delay is caused by an extra depth below the interface 306, the phase difference between the light passing through the first trench 310 and the second trench 320 is 90 degrees. It should be noted that a similar phase difference could be produced by having an extra thickness of glass having a dimension equal to $(2*d_{45p})$ in one of the first trench 310 or the second trench 320. In one embodiment, one of the first trench 310 or the second trench 320 can have a difference in depth of $(2*d_{45p})$ in the glass substrate 302 to produce a selected phase delay of the light between the two trenches.

In one embodiment, the glass substrate 302 comprises quartz and the layer of transmissive material 304 comprises molybdemum silicide (MoSi). The layer of molybdenum silicide (MoSi) is of a thickness to allow about 6% to about 20% of the light projected onto the MoSi layer to pass through the layer. In one embodiment, the difference between the first phase delay and the second phase delay is about 90 degrees. In another embodiment, the dimension that the first trench 310 is above the juncture or interface 306 and the dimension of the second trench 320 below the juncture or interface 306 is a value designated $d_{45p}$. The value designated $d_{45p}$, can be expressed mathematically as follows:

$$d_{45p}=2*\text{wavelength}/(n_{quartz}-1)*M,$$

where $n_{quartz}$ is the refractive index of quartz at the wavelength of the illuminator, and M is the magnification factor of the projection lens of the photolithographic projection system. For example, M=4 for most of the currently available photolithographic projection systems, but other values of M can also be used, as desired.

Figure 5:
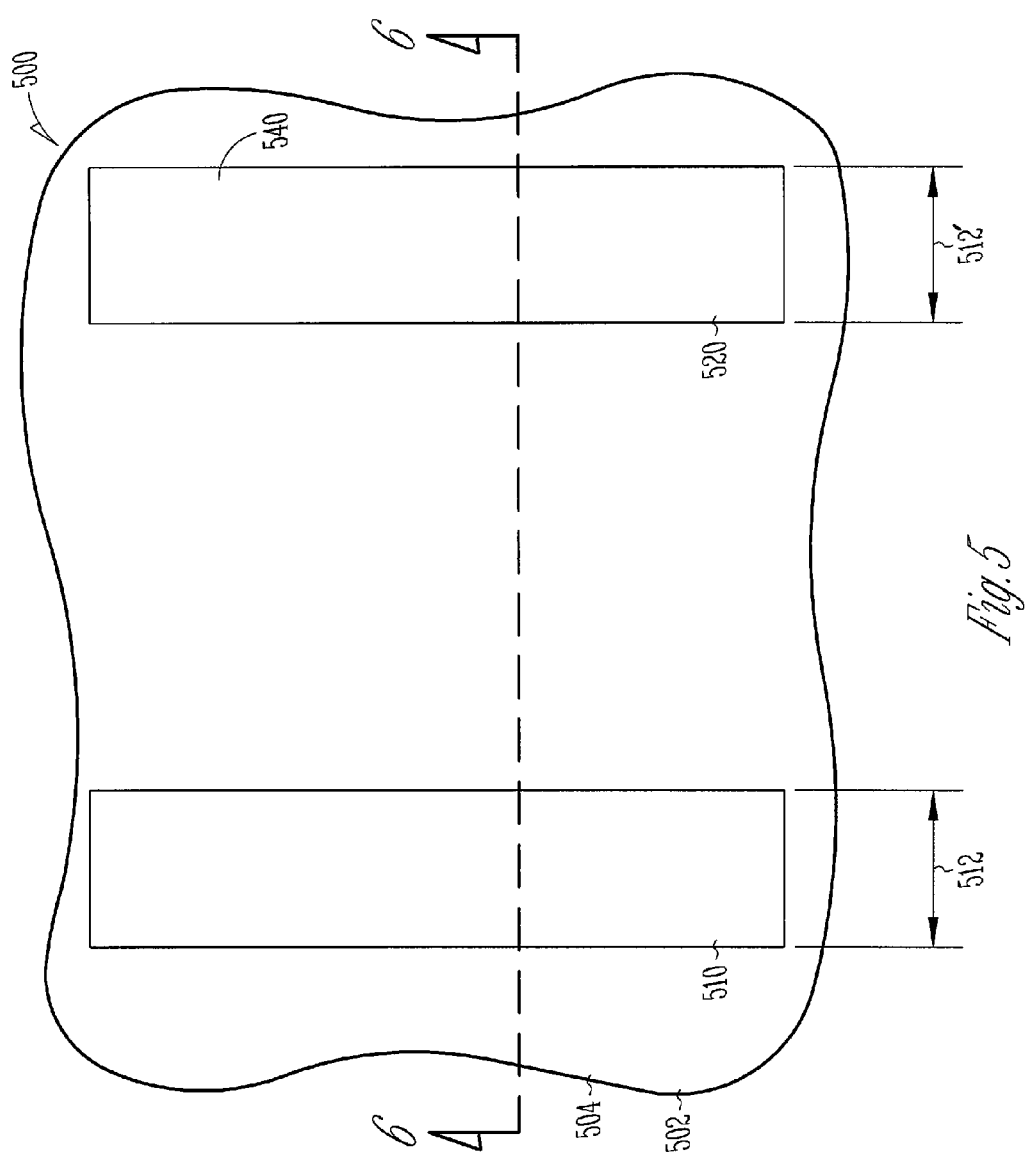
FIG. 5 is a top view of a mask feature showing a number of iso-lines, according to an example embodiment of the invention.
Figure 6:
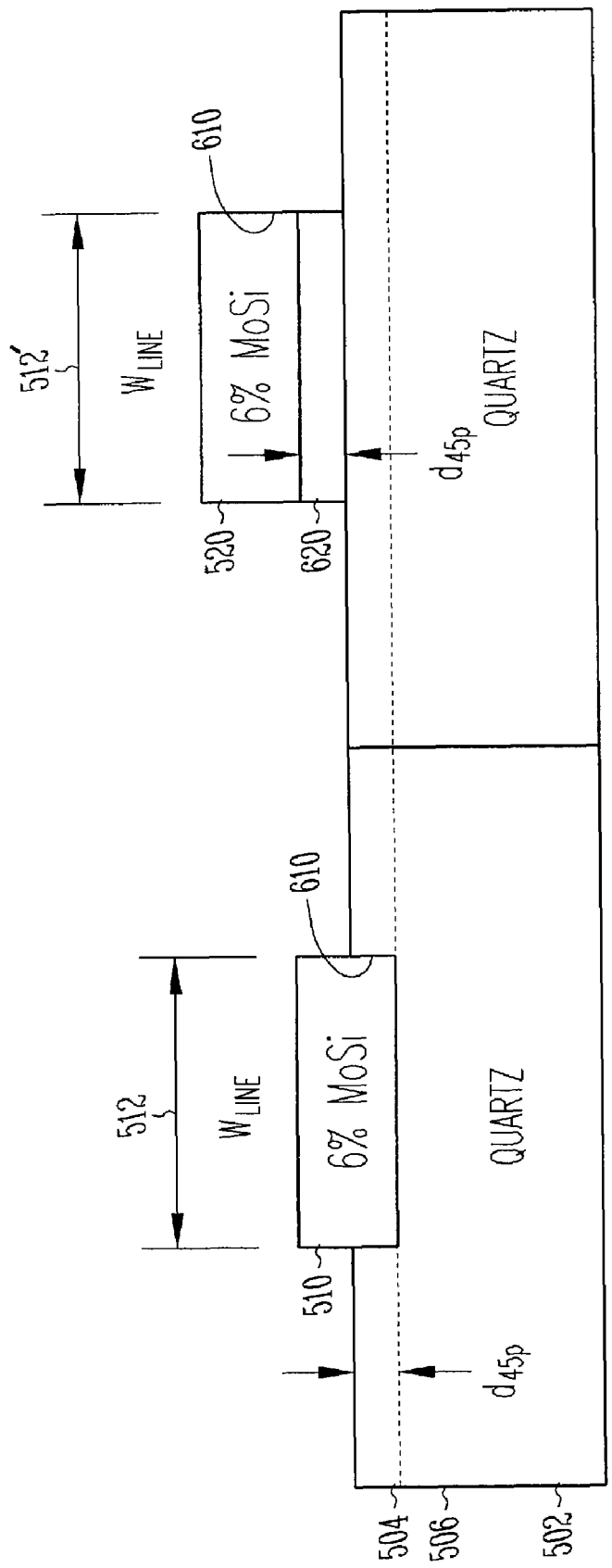
FIG. 6 is a cross-sectional side view of a mask along line 6-6 in FIG. 5, showing a first iso-line having a first background phase and a second iso-line having a second background phase.

FIG. 5 is a top view of a focus determination pattern 540 of a mask 500, and FIG. 6 is a cross-sectional side view of a focus determination pattern 540 of the mask 500, according to another example embodiment of the invention. The focus determination pattern 540 produces a focus (determination) feature on a target, such as a wafer. Now referring to both FIGS. 5 and 6, the focus determination pattern 540 includes a first iso-line of transmissive material 510 having a first feature phase and a second iso-line 520 having a second feature phase. The mask 500 for producing a semiconductor device includes a glass substrate 502. The glass substrate 502 has a first major surface 504 and a second major surface 506.

The first line of transmissive material 510 is positioned on the glass substrate 502. More specifically, the first line of transmissive material 510 is positioned in a trench 610 having a depth of removed glass that will produce a selected phase shift. The second line of transmissive material is positioned on a shoulder 620 on the glass substrate 502. The shoulder 620 has a thickness of glass that will also produce a selected phase shift in the light being transmitted through the glass substrate 502. The first iso-line of transmissive material 510 has a selected width 512. The second iso-line of transmissive material 520 may have substantially the same selected width 512' as the first iso-line of transmissive material 510. The second line of transmissive material 520 also produces a second selected phase delay different from that of the first phase delay.

In one embodiment, the glass substrate 502 comprises quartz, and the iso-lines of transmissive material 510, 520 comprise molybdemum silicide (MoSi). In one embodiment, the first line or the second line is formed in a trench 610 in the quartz. The trench 610 has a depth to cause a selected phase delay. The second line 520 is formed in an elevated line of quartz having a width 512' substantially the same as the selected width 512 and having a height selected to cause a selected phase delay. As mentioned previously, the portion that elevates the second iso-line 520 is referred to as a shoulder 620.

The difference in the thickness of the glass through which the light from a source is transmitted produces a phase difference. In one embodiment, the difference between the first phase delay and the second phase delay is about 90 degrees. It should be noted that the phase difference can also be caused by other arrangements, such as a first iso-line of transmissive material being positioned on the major surface 504 of the glass substrate 502 and the second iso-line transmissive material being positioned on a shoulder 620 sufficiently thick to produce the selected phase difference between the first iso-line and the second iso-line. Similarly, the first iso-line could be positioned in a trench 610 twice as deep as the one shown in FIGS. 5 and 6, while the second iso-line could be placed on the major surface 504 of the glass substrate 502.

As shown in FIGS. 5 and 6, the phase delay associated with the first iso-line 510 is a function of the depth of the trench 610. As shown in FIG. 6, the glass substrate has a trench 610 of removed glass having a thickness, designated $d_{45p}$, that produces a phase delay of 45 degrees with respect to the major surface 504 of the glass substrate 502. The second iso-line 520 includes an extra portion or thickness of glass associated with the shoulder 620 used to elevate the second iso-line of transmissive material. The thickness of this extra portion of glass is designated as $d_{45p}$. The extra portion of glass is positioned above the major surface 504 of the glass substrate 502. In other words, the first iso-line 510 is positioned in a trench 610 with a depth below the major surface 504 of the glass substrate 502. The second iso-line 520 is positioned atop a glass shoulder 620 having a thickness, designated $d_{45p}$, and produces a phase delay of 45 degrees with respect to the major surface 504 of the glass substrate 502.

If the glass substrate 502 is formed of quartz, the value, designated $d_{45p}$, for the thickness of the trench 610 and the height of the shoulder 620 can be expressed mathematically as follows:

$$d_{45p}=2*\text{wavelength}/(n_{quartz}-1)*M,$$

where $n_{quartz}$ is the refractive index of quartz at the wavelength of illuminator, and M is the magnification factor of the projection lens of the photolithographic projection system. For example, M=4 for most of the currently available photolithographic projection systems, but other values of M can also be used, as desired.

Figure 7:
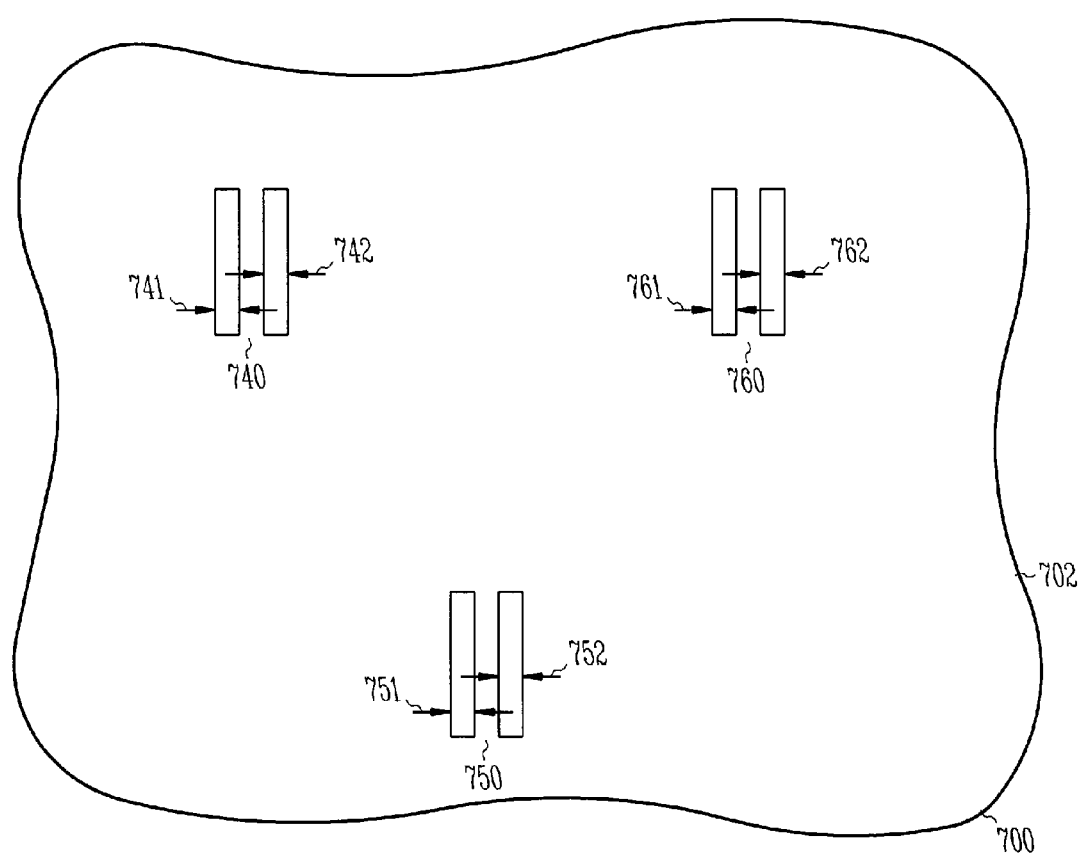
FIG. 7 is a top view of a wafer that includes at least one focus pattern formed on the major surface of the wafer, according to an example embodiment of the invention.

FIG. 7 is a top view of a wafer 700 that includes at least one focus feature 740 formed on the major surface 702 of the wafer 700, according to an example embodiment. In fact, as shown, the wafer 700 includes a first focus feature 740, a second focus feature 750, and a third focus feature 760, formed on the major surface 702 of the wafer 700. All the focus features 740, 750, and 760 are formed when light from a light source is transmitted through a mask that includes one or more focus determining patterns, such as is shown in FIGS. 3-6. Each focus feature 740, 750, and 760 actually includes a set of features that includes a first critical dimension and a second critical dimension.

Focus feature 740 includes critical dimensions 741 and 742. The critical dimension 741 measures the width of either a trench or a line that is formed on a major surface 702 of the wafer 700. Critical dimension 741 is a first critical dimension associated with a first line or trench while critical dimension 742 is a critical dimension associated with a second line or trench. A shown, the critical dimension 741 is different from the critical dimension 742, which is an indication that this particular focus feature formed on the wafer 700 has an amount of defocus. When the focus feature 740 is appropriately or substantially in focus, the difference between the critical dimensions 741 and 742 of the critical features will be substantially close to zero or zero. This is also referred to as the bias between the critical dimension 741 and the critical dimension 742. Focus feature 750 also has a first critical dimension 751 and a second critical dimension 752. These critical dimensions 751 and 752 are associated with either a first trench and a second trench, respectively, or a first line and a second line, respectively, that are as formed on the surface 702 of the wafer 700. As shown, the first critical dimension 751 and the second critical dimension 752 are substantially equal and therefore the amount of defocus is close to or substantially zero. This is an indication that the critical feature 750 is actually in focus. Also on the wafer 700 is a focus feature 760 that includes a first critical dimension 761 and a second critical dimension 762. Again, the first critical dimension is associated with a first line or trench and the second critical dimension 762 is associated with a second line or trench. As shown in FIG. 7, the first critical dimension 761 is larger than the second critical dimension 762, which indicates there is an amount of defocus between the mask and the target (e.g., wafer 700).

The various focus features 740, 750, and 760 can be formed onto a wafer in different locations, which may be related to the scanning slits and fields setups of the photolithographic projection system. The various focus feature 740, 750, and 760 give an indication of the amount of defocus associated with the projection of a mask onto the wafer, such as mask 120 onto the wafer 700 or other target. It should be noted that the focus features 740, 750, 760 can be placed in areas that would be destroyed upon separating a wafer into individual dice. The focus features can be placed in open areas or can be placed in streets that are used in singulating the various dice into individual dice. In other words, the focus features 740, 750, and 760 may be destroyed upon singulation of the wafer 700 into individual dies.

The wafer 700 includes a pattern for circuitry associated with a device and a focus pattern 740. The focus pattern 740 is positioned remotely from the pattern for circuitry. The focus pattern 740 contains features that include at least two critical dimensions 741 and 742 that are measured to yield an indication of an amount of defocusing. The wafer 700 also includes a major surface 702, wherein the at least two critical dimensions 741 and 742 measured are in the plane of the major surface 702. In one embodiment, the at least two critical dimensions 741 and 742 relate to the width 741 of a first trench and the width 742 of a second trench. In another embodiment, the at least two critical dimensions 741 and 742 relate to a width of a first line and a width of a second line. In one embodiment, the wafer 700 includes open areas used in singulating a number of devices formed on the wafer 700. The focus pattern 740 may be located in the open area used for singulating the wafer.

Figure 8A:
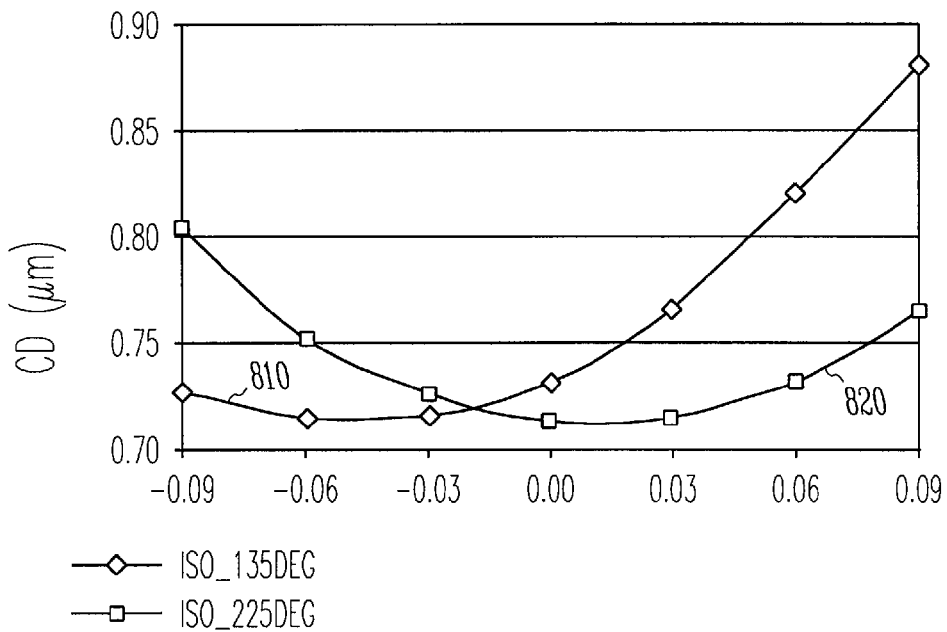
FIG. 8A is a graph of a first critical dimension for a first iso-trench and a second critical dimension for a second iso-trench related to the amount of defocus, according to an example embodiment of the invention.

FIG. 8A is a graph of a first critical dimension for a first iso-trench and a second critical dimension for a second iso-trench related to the amount of defocus, according to an example embodiment of the invention. The first iso-trench has a phase delay of approximately 135 degrees and is labeled with the reference number 810. The second iso-trench has a phase delay of approximately 225 degrees and is represented by the line carrying the reference numeral 820. In the graph shown in FIG. 8A, the critical dimension is shown in micrometers on the Y axis, and the defocus value is shown in micrometers on the X axis.

As shown in FIG. 8A, the defocus varies from a negative 0.09 to a positive 0.09 micrometers, and the critical dimension of the two trenches vary from 0.7 to 0.9 as the defocus value changes. For the various dimensions of the trench, as depicted by reference numeral 810, there are various amounts of defocus associated with the change in the critical dimension of the trench. In the middle of the X axis there is a zero amount of defocus that indicates that the iso-trench 810 and the iso-trench 820 are both in focus. The same plot is made for the second iso-trench, as depicted by reference numeral 820. Thus, the mask produces a first iso-trench and a second iso-trench having the same or substantially the same critical dimension in width when they are projected in a focused manner onto the target, such as the wafer 700 (shown in FIG. 7).

Figure 8B:
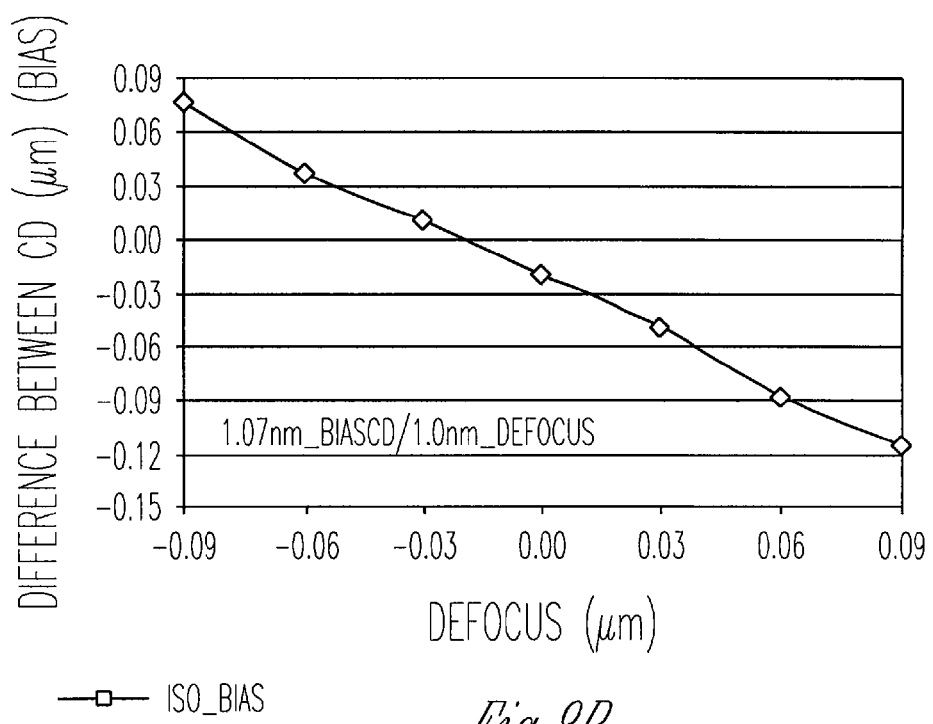
FIG. 8B is a graph of the difference between a first critical dimension for a first iso-trench and a second critical dimension for a second iso-trench related to the amount of defocus, according to an example embodiment of the invention.

FIG. 8B is a graph of the difference between a first critical dimension for a first iso-trench and a second critical dimension for a second iso-trench related to the amount of defocus, according to an example embodiment. FIG. 8B is another way of depicting an amount of defocus. Again, an amount of defocus in micrometers is shown on the Y axis and varies from a negative 0.09 to a positive 0.09 micrometers. The difference between the first critical dimension and the second critical dimension is plotted on the Y axis. Some of those having ordinary skill in the art refer to this as the bias between the first critical dimension and the second critical dimension. The amount of difference between the first critical dimension and the second critical dimension varies between a positive value and a negative value. The critical dimension values associated with the first trench 810 are subtracted from the critical dimension values for the second trench, as depicted by line 822, yielding the bias or difference between the first critical dimension and the second critical dimension. These differences then yield the bias per critical dimension as it relates to the amount of defocus.

Figure 9A:
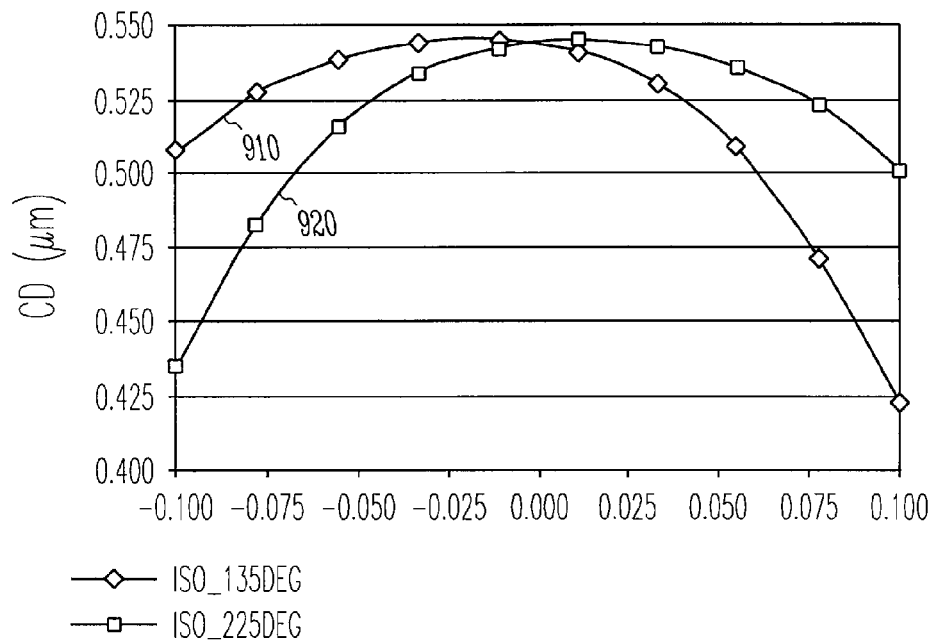
FIG. 9A is a graph of a first critical dimension for a first iso-line and a second critical dimension for a second iso-line related to the amount of defocus, according to an example embodiment of the invention.

FIG. 9A is a graph of a first critical dimension for a first iso-line and the second critical dimension for a second iso-line as they relate to the amount of defocus. This is very similar to the graph shown in FIGS. 8A and 8B with the exception that the feature is formed as an iso-line rather than a trench. The critical dimension for a first line of a focus feature is depicted by reference numeral 910 as it is plotted with respect to an amount of defocus. The critical dimension associated with the second iso-line as it varies with an amount of defocus is plotted and is shown as line 920 in FIG. 9A. Thus, again, the width of the iso-line varies with respect to the amount of defocus.

When light from the light source is transmitted through the patterns on the mask, such as patterns 740, 750, and 760, each pattern produces either a set of iso-lines or iso-trenches. The various phases and the pattern are selected such that if the pattern projected on to a target, such as the wafer 700 (shown in FIG. 7), is out of focus, the critical dimensions associated with the iso-lines or iso-trenches will be different. However, if the mask or the pattern formed by the mask is focused, the differences in the critical dimensions of the iso-lines or iso-trenches that are formed will be small or substantially zero, thereby indicating that the mask has been projected in focus onto the target or wafer 700 (see FIG. 7).

Figure 9B:
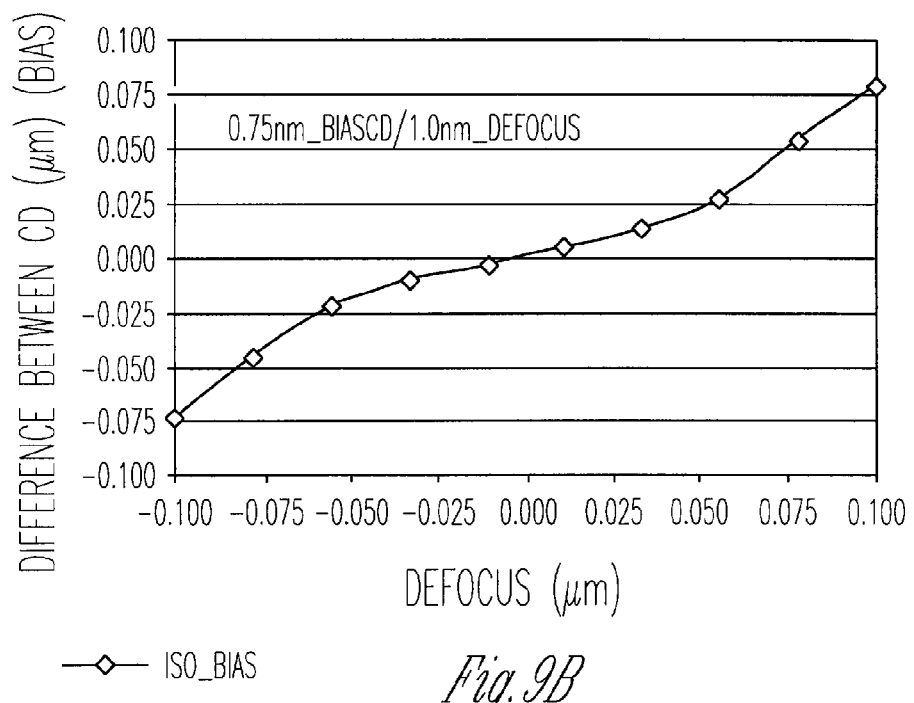
FIG. 9B is a graph of the difference between a first critical dimension for a first iso-line and a second critical dimension for a second iso-line related to the amount of defocus, according to an example embodiment of the invention.

FIG. 9B is a graph of the difference in the critical dimensions or the difference between the first critical dimension and the second critical dimension of a particular feature formed with an iso-line pattern, such as the one discussed with respect to FIGS. 5 and 6 above. As shown in FIG. 9B, the critical dimension associated with the first iso-line is subtracted from the critical dimension associated with the second iso-line to produce a bias value. As shown in FIG. 9B, the bias value between the first critical dimension and the second critical dimension gives an indication of the amount of focus or defocus of the pattern associated with the mask as it is projected onto the target. It should be noted that in many instances it may be desirable to have three patterns that indicate focus or defocus at the wafer level. Three points determine a plane. Therefore, if any one of the three points is out of focus or the critical dimensions differ, it can be said the plane of the mask is tilted with respect to the plane of the wafer or target 700. In some embodiments, one indication of whether the mask is in focus when projected onto the target, such as wafer 700 (shown in FIG. 7) is used. Each of the focus features do not need to be used in every instance.

Figure 10:
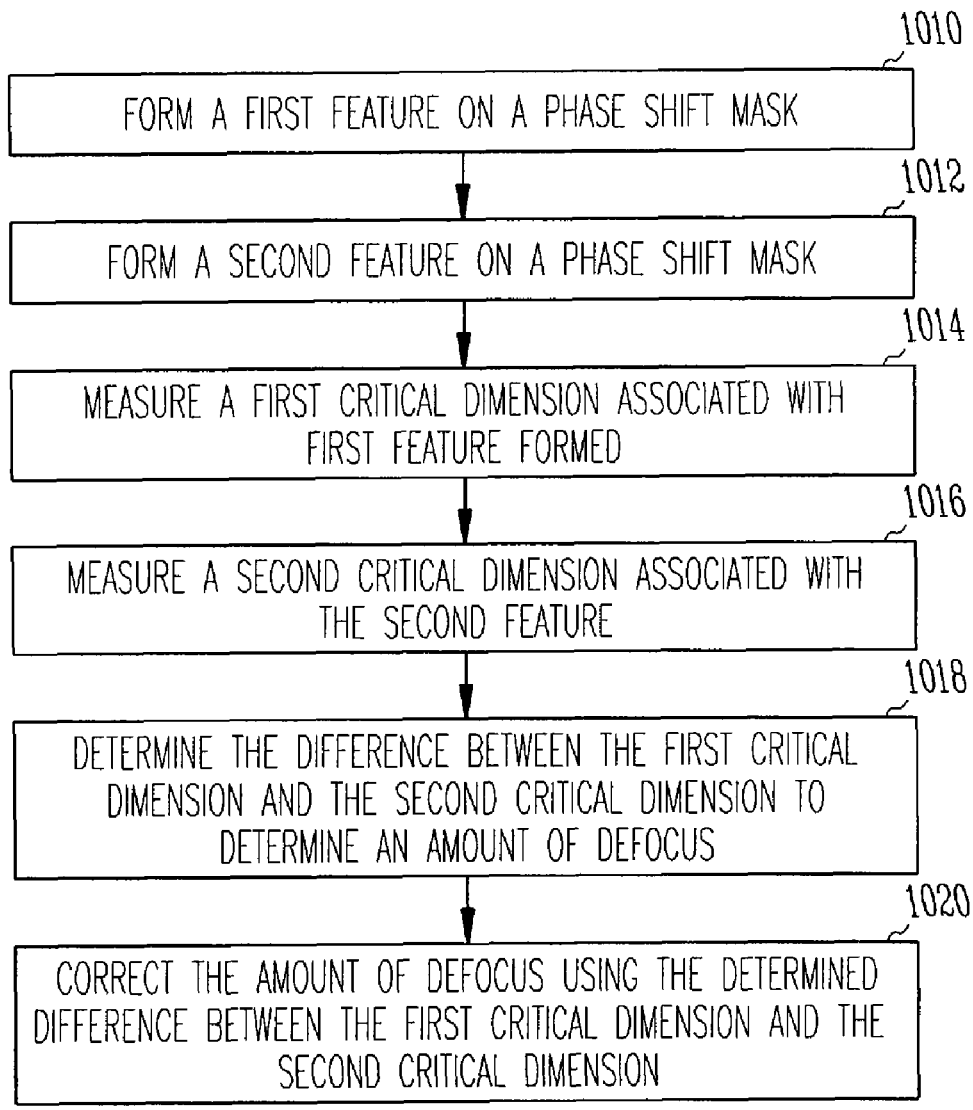
FIG. 10 is a flow diagram of a method for determining the amount of focus in a photolithographic projection system, according to an example embodiment of the invention.

FIG. 10 is a flow diagram of a method 1000 for determining an amount of focus or defocus in a photolithographic projection system 100, according to an example embodiment. The method 1000 includes forming a first pattern on a phase shift mask 1010, and forming a second pattern on the phase shift mask 1012. The first pattern may be formed to produce a first phase delay and the second pattern may be formed to produce a second phase delay different from the first.

The method 1000 also includes measuring a first critical dimension of a first feature formed on a target using the first pattern 1014, and measuring a second critical dimension associated with a second feature formed on a target using the second pattern 1016. The method 1000 also includes determining the difference between the first critical dimension and the second critical dimension to determine an amount of defocus 1018. The method 1000 may also include correcting the amount of defocus using the determined difference between the first critical dimension and the second critical dimension 1020.

In some embodiments, the difference between the first phase delay and the second phase delay is about 90 degrees. In one embodiment, the first pattern and the second pattern form a set of lines on the target. In another embodiment, the first pattern and the second pattern form a set of trenches on the target.

Thus, many embodiments may be realized, as various combinations of the apparatus (e.g., masks), systems, and methods of FIGS. 1-10 are considered. For example, a system 100 includes an illuminator 110, a mask, and a measurement device. The illuminator includes a light source. The mask includes at least one focus determination pattern having a first pattern portion and an adjacent second pattern portion. The first pattern portion and the second pattern portion have substantially the same width but produce a phase difference in light transmitted through the pattern portions. In one embodiment, the first pattern portion and the second pattern portion are trenches. In another embodiment, the first pattern portion and the second pattern portion are lines. The phase change difference between the first pattern portion and the second pattern portion cause a difference in the critical dimension associated with the features formed by the first pattern portion and the second pattern portion. The measurement device measures a first critical dimension and a second critical dimension of a feature produced on a target by the at least one focus determination pattern. The difference between the first critical dimension and the second critical dimension relates to an amount of defocus. The system may also include a feedback control loop where a determination regarding an amount of defocus is used to focus the position of a wafer or a mask or both of them onto the target. In one embodiment, the at least one pattern is located remotely from the other patterns of the mask. In another embodiment, the mask includes a plurality of focus determination patterns. In some embodiments, the plurality of focus determination patterns is positioned to determine an amount of tilt between the target and the mask. The mask, in some embodiments, includes at least three focus determination patterns located in remote areas of the mask. Some embodiments include a feedback control loop where a determination regarding an amount of defocus for at least three focus determination features is used to focus the position of a wafer or a mask or both of them onto the target. The measurement device, in one embodiment, comprises a scanning electron microscope.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A mask for producing a semiconductor device, the mask comprising:
   a glass substrate;
   a layer of transmissive material positioned on the glass substrate, the transmissive material being different from a material of the glass substrate; and
   an interface between the glass substrate and the layer of transmissive material, the mask having a first trench therein and a second trench therein, the first trench having a selected width and formed to produce a first phase delay, a portion of the glass substrate being located at a bottom of the first trench, the first trench having a depth that is above the interface of the transmissive material and the glass substrate, such that a sidewall of the first trench is formed from a portion of only the layer of transmissive material, the second trench adjacent to the first trench and having the selected width and formed to produce a second phase delay different from the first phase delay, the second trench having a depth below the interface of the transmissive material and the glass substrate, such that a sidewall of the second trench is formed from both a portion of the layer of transmissive material and a portion of the glass substrate.

2. The mask of claim 1, wherein the glass substrate comprises quartz.

3. The mask of claim 1, wherein the layer of transmissive material comprises molybdemum silicide (MoSi).

4. The mask of claim 3, wherein the layer of molybdenum silicide (MoSi) is of a thickness to allow about 6% to about 20% of light projected onto the layer to pass through the layer.

5. The mask of claim 1, wherein a difference between the first phase delay and the second phase delay is about 90 degrees.

6. The mask of claim 1, wherein a distance of the first trench above the interface and a distance of the second trench below the interface is substantially equal to a distance $d_{45p}$ defined as $d_{45p}=2*\text{wavelength}/(n_{quartz}-1)*M$, where $n_{quartz}$ is the refractive index of quartz at the wavelength of an illuminator, and M is a magnification factor of a projection lens included in a photolithographic projection system.

7. A mask for producing a semiconductor device, the mask comprising:
- a first material;
- a transmissive material different from the first material overlaying the first material at an interface, the first material including a first material portion above the interface;
- a first trench formed in the transmissive material and having a bottom located at the first material portion such that the bottom is above the interface, the first trench formed to produce a first phase delay; and
- a second trench formed in the transmissive material and in the first material, the second trench having a bottom below the interface, the second trench formed to produce a second phase delay different from the first phase delay.

8. The mask of claim 7, wherein the first material comprises glass.

9. The mask of claim 7, wherein the transmissive material is to allow about 6% to about 20% of light projected onto the transmissive material to pass through the transmissive material.

10. The mask of claim 7, wherein a difference between the first phase delay and the second phase delay is about 90 degrees.

11. The mask of claim 7, wherein the first trench and the second trench have substantially a same width.

* * * * *

UNITED STATES PATENT AND TRADEMARK OFFICE
CERTIFICATE OF CORRECTION

| | | |
|---|---|---|
| PATENT NO. | : 7,864,294 B2 | Page 1 of 1 |
| APPLICATION NO. | : 11/754578 | |
| DATED | : January 4, 2011 | |
| INVENTOR(S) | : Fei Wang et al. | |

It is certified that error appears in the above-identified patent and that said Letters Patent is hereby corrected as shown below:

IN THE CLAIMS:
In column 10, line 56, in Claim 3, delete "molybdemurn" and insert -- molybdenum --, therefor.

Signed and Sealed this
First Day of March, 2011

David J. Kappos
*Director of the United States Patent and Trademark Office*